United States Patent [19]

Day

[11] 4,359,780
[45] Nov. 16, 1982

[54] HIGH SPEED SQUELCH CIRCUIT

[75] Inventor: Charles M. Day, Algonquin, Ill.

[73] Assignee: Motorola, Inc. (Corporate Offices), Schaumburg, Ill.

[21] Appl. No.: 175,606

[22] Filed: Aug. 6, 1980

[51] Int. Cl.³ .............................................. H04B 1/10
[52] U.S. Cl. ................................... 455/222; 455/212; 179/1 P
[58] Field of Search ............... 455/63, 212, 214, 218, 455/219, 221, 222, 225, 224, 278, 283, 296, 303, 311, 312; 330/141; 328/165, 167; 329/130; 179/1 VL, 1 P

[56] References Cited

U.S. PATENT DOCUMENTS

| 3,596,184 | 7/1971 | Hanus . | |
| 3,628,058 | 12/1971 | Espe . | |
| 3,660,765 | 5/1972 | Glasser . | |
| 3,728,634 | 4/1973 | Watkinson | 455/221 |
| 3,769,592 | 10/1973 | Espe . | |
| 3,805,166 | 4/1974 | Paredes . | |
| 3,934,206 | 1/1976 | Holecek . | |
| 3,979,679 | 9/1976 | Bush | 455/222 |

*Primary Examiner*—Tommy P. Chin
*Attorney, Agent, or Firm*—James W. Scheer; James W. Gillman

[57] ABSTRACT

A high frequency squelch circuit for communications receivers with relatively long time delay when operating on weak signals with a short time delay on strong signals which completely eliminates any audible noise burst, and with continuously variable delay as an inverse function of signal strength at intermediate signal levels. The high speed squelch performance is achieved without degrading chatter performance by operating at frequencies above the audio range and utilizing wider noise bandwidth.

8 Claims, 3 Drawing Figures

HIGH SPEED SQUELCH CIRCUIT

BACKGROUND OF THE INVENTION

1. Field of the Invention

This invention relates to squelch circuitry used in radio receivers to cut out noise between intervals of signal transmission, and is directed particularly to improvements on such circuits wherein the squelch time delay is such that no squelch noise burst is audible at the end of a received transmission under strong signal conditions.

2. Description of the Prior Art

In radio receivers, particularly in high gain communication receivers, it is common practice to employ squelch circuits operative to automatically block off the audio output in the absence of transmitted signal intelligence or carrier modulation, so that annoying receiver noise will not be heard during intervals between signal reception. Upon the resumption of a signal being received after an interval of silence, the squelch circuit opens the audible path again, allowing the signal to be heard as long as it is present. Prior art squelch circuits, however, are deficient in various respects principally in that they operate with an inherent time delay. In mobile radio communication, particularly when either or both mobile transmitting and receiving units are moving, the level of signal reaching the receiver varies up and down, such variation being commonly referred to as "flutter" or "fades". Such rapid signal strength variation is also frequently caused by atmospheric conditions.

In prior art squelch circuits a long delay time constant is utilized to permit the signal to vary up and down rapidly before the squelch has time to operate thereby avoiding chopping holes in the speech transmission being received in the presence of rapid flutter. While such use of long time delay effectively prevents loss of signal or partial loss of signal under conditions of flutter, there is the advantaage that when signals are at a constant strong level a long noise burst is heard at the end of each transmission interval before the squelch circuitry has had time to operate. Since this noise burst or squelch tail is very annoying at high signal strengths, it is desirable to eliminate this annoying burst of noise during strong signal conditions. One prior art approach is to use circuitry which provides a dual time constant where the time constant is relatively long for weak signals and considerably shortened for strong signals. Another type of squelch circuitry utilizes a variable approach, where a relatively long time constant is provided at weak signals but the time constant varies proportional to the RF signal strength until it reaches a considerably shortened time constant under strong signals. Unfortunately, such prior art squelch circuitry samples noise in the audio range of frequencies and as a result they are not able to provide a sufficiently short time constant under strong signal conditions to completely eliminate the annoying noise burst under such signal conditions.

SUMMARY OF THE INVENTION

It is, accordingly, the principle object of this invention to provide a novel and improved squelch circuit wherein the effective time constant under strong signal conditions is short enough to completely eliminate the noise burst in the audio at the end of the received transmission.

Another object of the invention is to provide a variable time constant, which allows a long time constant under weak signal condition and varies the time constant proportional to the RF signal strength such that under strong signal conditions the audible noise burst is completely eliminated.

Briefly, in accordance with one embodiment of the invention, a filter circuit is adapted to receive detected noise voltage from a receiver and is responsive to high frequency noise above the audio frequency range (preferably frequencies from 40 kHz to 100 kHz). The filter circuit filters the detected noise voltage to develop a filtered noise voltage which is composed of a wide bandwidth of noise frequencies above the audio frequency range. This filtered noise voltage is coupled to a squelch control circuit whic develops a squelch control voltage in response to the filtered noise voltage.

According to another feature of the invention, circuitry is provided to amplify the filtered noise voltage and to limit the amplified noise voltage from the filter circuit. This amplified, limited and filtered noise signal is then coupled to the squelch control circuit.

According to yet another feature of the invention, the squelch control circuit utilizes a relatively long time to respond to the noise voltage under weak signal conditions and varies the time to respond proportional to the RF signal strength under strong signal conditions.

The invention as herein described provides the overall muting speeds necessary to achieve total squelch tail elimination. In addition, the circuit can achieve these speeds without serious degradation of the squelch circuit chatter, clamping and lock-up performance by sampling a wide band of high frequency noise.

BRIEF DESCRIPTION OF THE DRAWINGS

The features of the present invention which are believed to be novel are set forth with particularity in the appended claims. The invention itself, together with further objects, features and advantages thereof may best be understood by reference to the following description when taken in conjunction with the accompanying drawings.

DETAILED DESCRIPTION OF THE PREFERRED EMBODIMENT

Figure 1:
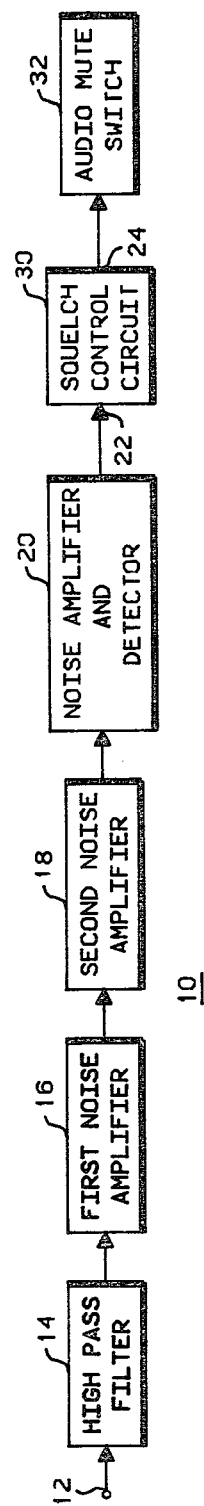
FIG. 1 is a block diagram of the novel squelch circuit in accordance with the invention.

Referring to FIG. 1, there is shown a block diagram of a squelch circuit 10 according to the invention. This circuit can be utilized with any communication receiver employing a wide band discriminator. Signals from a receiver discriminator are applied to an input 12 of a high-pass filter 14. The high-pass filter 14 is preferably an active filter. Unlike prior art squelch circuitry, the high-pass filter 14 has a cut-off frequency which is set at slightly beyond the receiver's audio bandwidth (i.e., above the audio frequency range) such that only the high frequency noise is sampled and no audio or audio harmonics are allowed to pass. Ideally, a band of frequencies from approximately 40 kHz to 100 kHz would be sampled. Since the amount of noise that exists at this higher band of frequencies is small, the filtered noise signal from high-pass filter 14 is applied to noise amplifiers 16, 18 and 20, respectively. Sufficient gain is provided to put the noise amplifier and detector 20 into hard limit. The hard limiting keeps the amplitude of the noise peaks from increasing as would normally occur when the carrier is deviated at the maximum system deviation. As a result of this limiting and the higher frequency of sampled noise, less filtering is required of the detected noise in order to maintain good chatter performance. Sampling a wide bandwidth of this higher frequency of sampled noise allows a greater reduction of filtering to achieve the speeds necessary to eliminate the noise burst at high signal strengths without degrading chatter performance due to lack of filtering. Another advantage is that no audio harmonics are allowed to be amplified under maximum system deviation thereby eliminating lock-up and reducing clamping.

The signal from the noise amplifier 18 is applied to the noise amplifier and detector 20 where it is amplified, detected and limited to provide limited noise pulses to the input 22 of a squelch control circuit 30. The output terminal 24 of the squelch control circuit 30 is coupled to a audio mute switch 32, which, in the preferred embodiment, will mute the audio when the voltage at output terminal 24 exceeds one-half the supply voltage.

Figure 2:
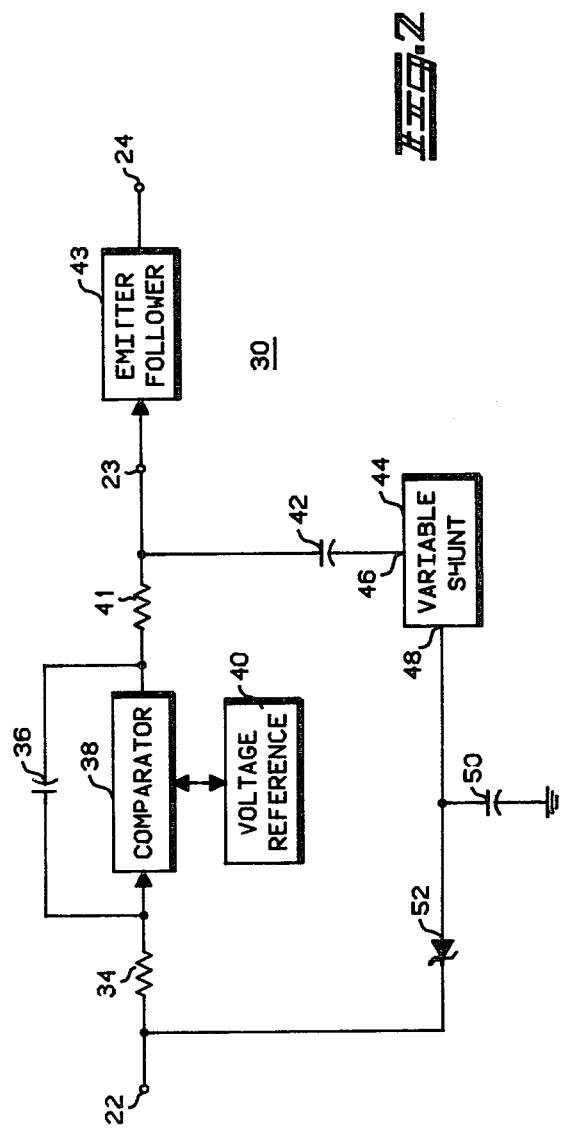
FIG. 2 is a block diagram of the squelch control circuit block illustrated in FIG. 2.

Referring now to FIG. 2, the squelch control circuit 30 of FIG. 1 is shown in block diagram form. In the preferred embodiment, the control circuit 30 provides a variable squelch tail. However, a control circuit utilizing a dual-time constant can be employed. The limited noise pulses supplied to the input 22 are coupled through the resistor 34 to the input of a comparator 38. This comparator acts also as an active integrator formed by the resistor 34 and a capacitor 36 in the comparator feedback path. This configuration allows a very fast RC time constant (i.e. resistor 34 and capacitor 36) when the DC average of the noise pulses are below the comparator's reference voltage (supplied by a reference voltage source 40), and actively increases the integration time by the open loop gain of the comparator 38 as the DC average approaches the reference voltage. Thus, it provides the required filtering only during the comparator's transition state, allowing high speed with excellent filtering to permit good chatter performance at threshold.

The output of the comparator 38 is coupled through a resistor 41 to a terminal 23 and to a capacitor 42. Also coupled to the terminal 23 is an emitter follower 43 which provides isolation between terminal 23 and the output terminal 24. The capacitor 42 is coupled directly to the output 46 of a variable shunt 44. The input 48 of the variable shunt 44 is coupled directly to a capacitor 50, whose second terminal is connected directly to ground as shown. In addition, the input 48 of the variable shunt 44 is coupled directly to the anode of a Zener diode 52. The cathoe of the Zener diode 52 is coupled to the input 22, as shown.

When the comparator 38 changes state, it changes the charge on the capacitor 42 through the resistor 41. The charge on the capacitor 42 also depends on the voltage at the output 46 of the variable shunt 44.

In the case of a weak signal, the voltage of the output 46 of the variable shunt 44 is at the supply voltage and will not be changed until the signal at its input 48 increases sufficiently to activate it. This means that the charge on the capacitor 42 during weak signal conditions is the supply voltage minus the low state output voltage of the comparator 38. As a result, when a transmission ends, the comparator 38 output voltage goes high and the resistor 41 discharges the capacitor 42 until the voltage at the emitter follower output 24 exceeds half the supply voltage which causes the mute switch 32 (shown in FIG. 1) to mute the audio.

In the case of a strong signal, the variable shunt 44 voltage is at its minimum of approximately one-third of the supply voltage and the charge on the capacitor 42 is approximately one-third of the supply minus the low state voltage of the comparator 38, which is approximately one-sixth of the supply voltage. When the transmission ends, the comparator 38 output voltage goes high, but not in sufficient time to eliminate the squelch tail. However, the variable shunt output goes from one-third supply to approximately full supply in approximately 40 microseconds, as determined by the discharge rate of the capacitor 50. Thus, when the variable shunt output 46 goes to the supply voltage, the capacitor 42 still has a charge of one-sixth of the supply voltage on it causing the output of the emitter follower 43 to be approximately five-sixths the supply voltage minus the base-emitter drop of emitter follower 43. This voltage is well above the one-half supply voltage needed to make the audio mute switch mute the audio. Therefore, at high signal strengths the audio is muted in approximately 40 microseconds which is faster than the approximately 60 microseconds delay caused by the de-emphasis corner of the receiver's audio bandpass which is located before the mute switch. As a result, the mute switch is able to close before the noise burst is audible.

During intermediate signal strength conditions, the variable shunt output 46 voltage is greater than its minimum and is inversely dependent upon the signal strength. Thus, the charge on the capacitor 42 is varied in proportion to the signal strength, causing the squelch tail to vary proportionally to signal strength.

Figure 3:
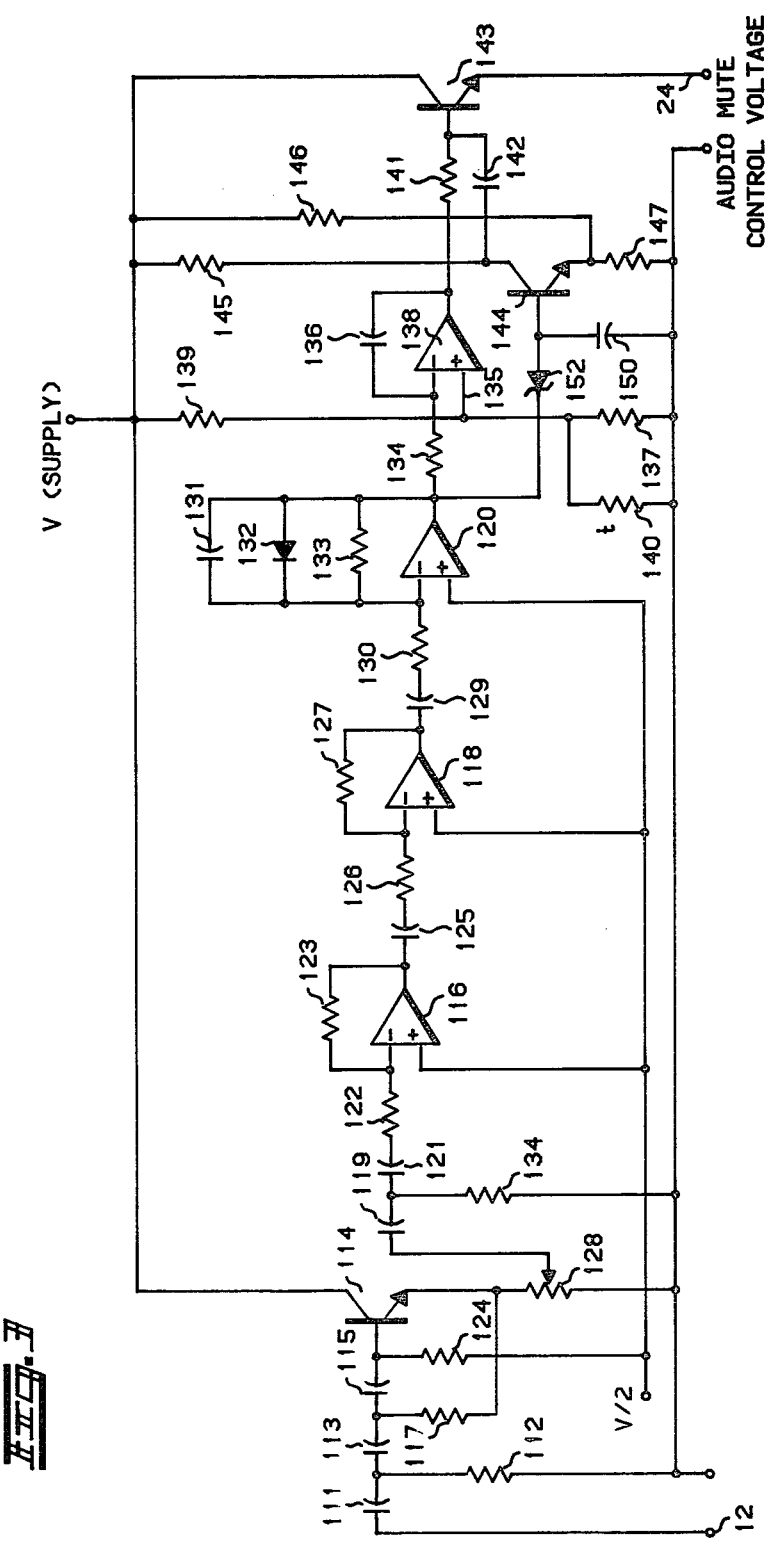
FIG. 3 is a detailed schematic diagram of the circuit illustrated in FIG. 1.

Referring now to FIG. 3, there is shown a detailed schematic diagram of a squelch circuit as shown in the block diagram in FIG. 1. In the circuit of FIG. 3, wideband signals from a radio receiver discriminator are applied to the input terminal 12. Capacitors 111, 113, 115, resistors 112, 117 and 124 and 128 and transistor 114, are connected as shown to form an active three pole high-pass filter whose corner frequency is set at well above the receiver IF passband (i.e. well above the audio frequency range). The variable resistor 128 is used to adjust the squelch sensitivity by controlling the amount of high frequency noise that is coupled to the following circuitry. The V/2 point that resistor 124 and operational amplifiers 116, 118 and 120 connect to, is a half supply point supplied by either a resistor divider or a half supply reference (not shown) which could also be used by the receiver circuitry. The capacitor 119 and the resistor 134 form an additional passive high-pass filter with the same cut off frequency as the previous three pole active filter to provide additional filtering. Capacitor 121, resistors 122 and 123 and operational amplifier 116 form a first high frequency gain stage whose corner frequency is set by the capacitor 121 and the resistor 122. This stage and the following two stages are AC coupled with a high corner frequency to prevent amplification of the audio harmonics. The signal from the first high frequency gain stage is coupled to a second high frequency gain stage composed of capacitors 125, resistors 126 and 127 and operational amplifier 118. The signal from this second high frequency gain stage is coupled to the third high frequency gain stage and detector composed of capacitor 129, resistors 130 and 133 and operational amplifier 120. The addition of the diode 132 in the feedback circuit of operational amplifier 120 causes the stage to allow only negative going noise pulses to pass, and limits the positive going pulses to the forward diode drop of the diode 132. The effect of this stage is to produce limited positive going noise pulses to be filtered by the next stage. The capacitor 131 is provided in the feedback circuit of operational amplifier 120 to set the upper frequency corner of this stage to insure stable amplification under a wide range of temperature extremes. The signal from operational amplifier 120 is coupled to a dual purpose comparator integrator stage formed by resistors 134, 140, 137, and 139, capacitor 136 and the operational amplifier 138. When the noise pulses from the amplifier 120 have a DC filtered average voltage less than the reference voltage at the input 135 of the operational amplifier 138, the output of the operational amplifier 138 is in the high state. The reference voltage at the input 135 of operational amplifier 138 is determined by the resistors 140, 137 and 139. When the DC noise pulses have a filtered DC average voltage greater than the voltage at the input 135 of the operational amplifier 138, then the output of the operational amplifier 138 is in a low state. The filtering is accomplished by the resistor 134 and the capacitor 136 which is in the feedback path of the operational amplifier 138.

When the filtered DC average of the noise pulses is well above or below the reference voltage at the input 135 of the operational amplifier 138, then the filtering is strictly determined by the resistor 134 and the capacitor 136. However, as the filtered DC average approaches the reference voltage at the input 135 of the operational amplifier 138, the operational amplifier 138 amplifies the integration time of the resistor 134 and the capacitor 136 by its open loop gain. This action greatly increases the filtering only during the transitions from one output state to another of the operational amplifier 138 and greatly reduces the squelch chattering at this threshold condition. The resistor 140 is a thermistor and is used to vary the reference voltage to track the IF output noise as it varies over temperature. The resistor 141, the capacitor 142 and the emitter follower transistor 143, coupled to the operational amplifier 138 as shown, form a circuit for controlling an audio mute switch (shown in FIG. 1) with the audio mute control voltage which is applied to the output terminal 24. The audio mute switch is preferably chosen so that its "on" state is any voltage below the half supply V/2 and whose "off" state is any voltage above half supply voltage V/2. When the operational amplifier 138 is in its low state, the base of the transistor 143 is well below one-half the supply voltage and therefore the audio mute gate will be maintained in its on state. When a received signal is terminated, the rapid increase in high frequency noise will cause the operational amplifier 138 to go into its high state. The transistor 143, however, does not conduct until the charge on the capacitor 142 allows the voltage at the base of the transistor 143 to exceed one-half the supply plus its base emitter voltage drop. When the base voltage exceeds this voltage, the transistor 143 conducts and pulls the voltage to the mute gate above one-half the supply voltage thereby muting the audio. The time for this to occur is determined by the time constant of the resistor 141 and capacitor 142 and by the amount of charge on capacitor 142.

The charge on the capacitor 142 is determined by a variable shunt circuit formed by the Zener diode 152, the capacitor 150, resistors 147, 145 and 146, and the transistor 144. The collector of transistor 144 is connected to one end of the capacitor 142 so that the charge on the capacitor 142 is largely determined by the collector voltage of the transistor 144. The divider ratio formed by the resistors 147 and 146, plus the base emitter drop of the transistor 144 set the voltage at which the transistor 144 turns on. When the transistor 144 turns on, its collector voltage is lowered from the supply voltage to a voltage equal to the saturation voltage plus the voltage created at the emitter of transistor 144 by the divider composed of resistors 147 and 146. The Zener diode 152 and the capacitor 150 form a non-linear RC network to integrate the noise pulses from the operational amplifier 120 into a DC control voltage applied to the base of the transistor 144. The reference voltage at the base of the transistor 144 generated by the divider network composed of resistors 147 and 146 is set such that the transistor 144 does not provide any change in the collector voltage to the capacitor 142 until the received signal is slightly greater (approximately 4 dB in the preferred embodiment) than the squelch's threshold for opening. When the received signal is less than this threshold, the collector of the transistor 144 is at the supply voltage. As a result, when the received signal is terminated, the maximum time will be required for the capacitor 142 to charge sufficiently so that the base of transistor 143 is greater than one-half the supply voltage thereby muting the audio after the charging time interval.

When the received signal is substantially greater than (8 dB above in the preferred embodiment) the squelch threshold, the transistor 144 is completely saturated and the charge on the capacitor 142 is at a minimum because the amplifier 138 is also in a low state. With the termination of the received signal, the Zener diode 152 discharges the capacitor 150 in a matter of microseconds through its non-linear action and through the output of the operational amplifier 120. This causes the collector of the transistor 144 to rise to the supply voltage in a matter of microseconds as well, but the charge on the capacitor 142 can only charge or discharge through the resistor 141. Therefore, the base of the transistor 143 is raised to the supply voltage minus the charge on the capacitor 142 in a matter of microseconds. As a result, the audio is muted in microseconds because the voltage at the base of the transistor 143 has been raised well above one-half of the supply, as required to mute the audio.

When the receiver signal strength is greater than 4 dB but less than 8 dB above the squelch threshold, the transistor 144 operates linearly and its collector voltage varies inversely to the signal strength. Thus the charge on the capacitor 142 is varied proportionately to the signal strength causing the closing time constant of the squelch to also vary proportional to signal strength. The shunt circuit is not variable over the full range of signal strength in order to provide the optimum flutter and fade performance when used in a mobile radio environment.

It can be seen that a high speed squelch circuit with variable squelch tail is provided which is capable under strong signal conditions of completely eliminating any audible noise burst. In addition, the circuit maintains a long squelch tail during weak signal conditions and varies the length of the squelch tail over intermediate strength signals. Finally, even though extremely short squelch times are achieved, good chatter clamping and lock up performance are achieved.

While a preferred embodiment of the invention has been described and shown, it should be understood that other variations and modifications may be implemented. It is therefore contemplated to cover by the present application any and all modifications and variations that fall within the true spirit and scope of the basic underlying principles disclosed and claimed herein.

What is claimed is:

1. A communications receiver squelch circuit operable in response to detected noise voltage comprising:
    (a) filter means, adapted to receive the detected noise voltage and being responsive to high frequency noise, for filtering the detected noise voltage to develop a filtered noise voltage;
    (b) comparator means, having an input and an output for comparing the filtered noise voltage to a reference voltage and for generating a control signal at the output when said filtered noise voltage exceeds said reference voltage;
    (c) variable shunt means, having an input and an output coupled to the comparator means output, for generating a voltage inversely dependent upon a signal coupled to the input;
    (d) capacitor means, for coupling the output of the variable shunt means to the output of the comparator means;
    (e) integrator means, coupled to the comparator means input, for integrating filtered noise voltage and coupling the integrated noise voltage to the shunt means input.

2. The communications receiver squelch circuit of claim 1 further comprising:
    amplifier means, coupled to the filter means, for amplifying the filtered noise voltage and for coupling the amplified noise voltage to the comparator means.

3. The communications receiver squelch circuit of claim 2 further comprising:
    limiter means, coupled to the amplifier means, for limiting the amplified noise voltage and for coupling the limited noise voltage to the comparator means.

4. The communications receiver squelch circuit of claims 1, 2 or 3 wherein the filtered noise voltage is composed of noise frequencies from approximately 40 kHz to 100 kHz.

5. The communications receiver squelch circuit of claims 1 or 3 wherein the comparator means further comprises an active integrator for increasing filtering when the average of the filtered noise voltage approaches the reference voltage.

6. The communications receiver squelch circuit of claim 4 wherein the integrator means in a non-linear integrator.

7. The communications receiver squelch circuit of claim 5 further comprising amplifier means coupled to the comparator means output for amplifying the control signal and coupling the amplified control signal to an output.

8. The communications receiver squelch circuit of claim 7, wherein the integrator means is a non-linear integrator.

* * * * *